(12) United States Patent
Agrawal et al.

(10) Patent No.: US 11,815,532 B2
(45) Date of Patent: Nov. 14, 2023

(54) CORELESS AUTO-CALIBRATING CURRENT SENSOR FOR MEASURING CURRENT IN AN ADJACENT WIRE

(71) Applicant: Infineon Technologies AG, Neubiberg (DE)

(72) Inventors: Milan Agrawal, Munich (DE); Dominik Durner, Essenbach (DE); Wolfgang Raberg, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 39 days.

(21) Appl. No.: 17/534,677

(22) Filed: Nov. 24, 2021

(65) Prior Publication Data
US 2023/0160929 A1 May 25, 2023

(51) Int. Cl.
*G01R 15/20* (2006.01)
*G01R 19/00* (2006.01)

(52) U.S. Cl.
CPC ....... *G01R 15/207* (2013.01); *G01R 19/0092* (2013.01)

(58) Field of Classification Search
CPC .................... G01R 15/207; G01R 19/0092
See application file for complete search history.

(56) References Cited

U.S. PATENT DOCUMENTS

| 2011/0057650 | A1* | 3/2011 | Hellwig | G01R 33/072 324/252 |
|---|---|---|---|---|
| 2014/0266178 | A1 | 9/2014 | Ausserlechner | |
| 2015/0309127 | A1 | 10/2015 | Ausserlechner | |
| 2020/0408857 | A1* | 12/2020 | Daubert | G01R 33/0041 |
| 2022/0082590 | A1* | 3/2022 | Steuer | G01R 15/181 |

FOREIGN PATENT DOCUMENTS

| CN | 108594151 A | 9/2018 |
|---|---|---|
| WO | 2013151792 A1 | 10/2013 |

* cited by examiner

*Primary Examiner* — Dominic E Hawkins
(74) *Attorney, Agent, or Firm* — Banner & Witcoff Ltd.

(57) ABSTRACT

The described techniques address issues associated with coreless current sensors by implementing a current sensor solution that may use as few as two, two-dimensional (2D) linear sensors. The discussed techniques provide a coreless current sensor solution that is independent of the sensor position with respect to a current-carrying conductor. An algorithm is also described for auto-calibration of sensor position with respect to a current-carrying conductor to calculate the current flowing through the conductor. The calculation of current may be performed independent of the position of the current-carrying conductor with respect to the sensor, and thus the disclosed techniques provide additional advantages regarding installation flexibility without sacrificing measurement accuracy.

25 Claims, 7 Drawing Sheets

CORELESS AUTO-CALIBRATING CURRENT SENSOR FOR MEASURING CURRENT IN AN ADJACENT WIRE

TECHNICAL FIELD

Aspects described herein generally relate to current sensors or a sensor system and, more particularly, to current sensors that utilize measured magnetic fields to measure current carried through a conductor such as a wire.

BACKGROUND

For many applications, it is desirable to sense the current flowing through a wire in a non-obtrusive manner, i.e. without using a galvanic coupling to the wire and allowing the wire to remain intact during the measurement. A common way to perform such current measurements is via the use of magnetic fields sensors that are disposed adjacent to the current-carrying wire that measure a generated magnetic field, and then applying known mathematical relationships between the magnetic field strength and the current amplitude. In the domain of non-contact current sensors, two primary solutions exist in the market today: cored current sensors and coreless current sensors. The current use of each type of sensor has various drawbacks.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The example aspects of the present disclosure will be described with reference to the accompanying drawings. The drawing in which an element first appears is typically indicated by the leftmost digit(s) in the corresponding reference number.

SUMMARY

Again, existing current sensors include cored current sensors and coreless current sensors. Cored current sensors use a magnetic core to concentrate magnetic flux, which encounters core hysteresis that may affect measurement accuracy. For non-contact coreless sensor solutions, a sensor (e.g. a Hall sensor) is placed in close proximity to a current-carrying conductor to sense a magnetic field. Using a calibration technique, a proportionality between the current and the sensed magnetic field is established, which is then used as the basis of calculating the current amplitude through the adjacent wire. However, this proportionality relationship is only valid as long as the position of sensor does not alter over time with respect to the current-carrying wire. Thus, this dependence on a non-varying position of the sensor with respect to the current-carrying wire limits the application of coreless current sensors.

To address the issues related to the dependency on wire position for coreless current sensors, the concept of a coreless circular sensor array has been proposed. This includes the use of three 2D-Hall sensors with a microcontroller unit (MCU). However, current solutions implementing such sensors do not consider the tilt of the current-carrying wire with respect to the sensor plane. Moreover, implementations that attempt to compensate for the tilt of the current carrying wire are expensive and complex.

The embodiments as described herein address the issues associated with coreless current sensors by implementing a current sensor solution that may use as few as two, 2D linear magnetic field sensors. The embodiments discussed in further detail herein provide a coreless current sensor solution that is independent of the sensor position with respect to a current-carrying conductor. An algorithm is also described herein for auto-calibration of sensor position with respect to a current-carrying conductor to calculate the amplitude of the current flowing through the conductor. As the embodiments enable the calculation of current amplitude independent of the position of the current-carrying conductor with respect to the sensor, the embodiments provide additional advantages regarding installation flexibility without sacrificing measurement accuracy.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Figure 1A:
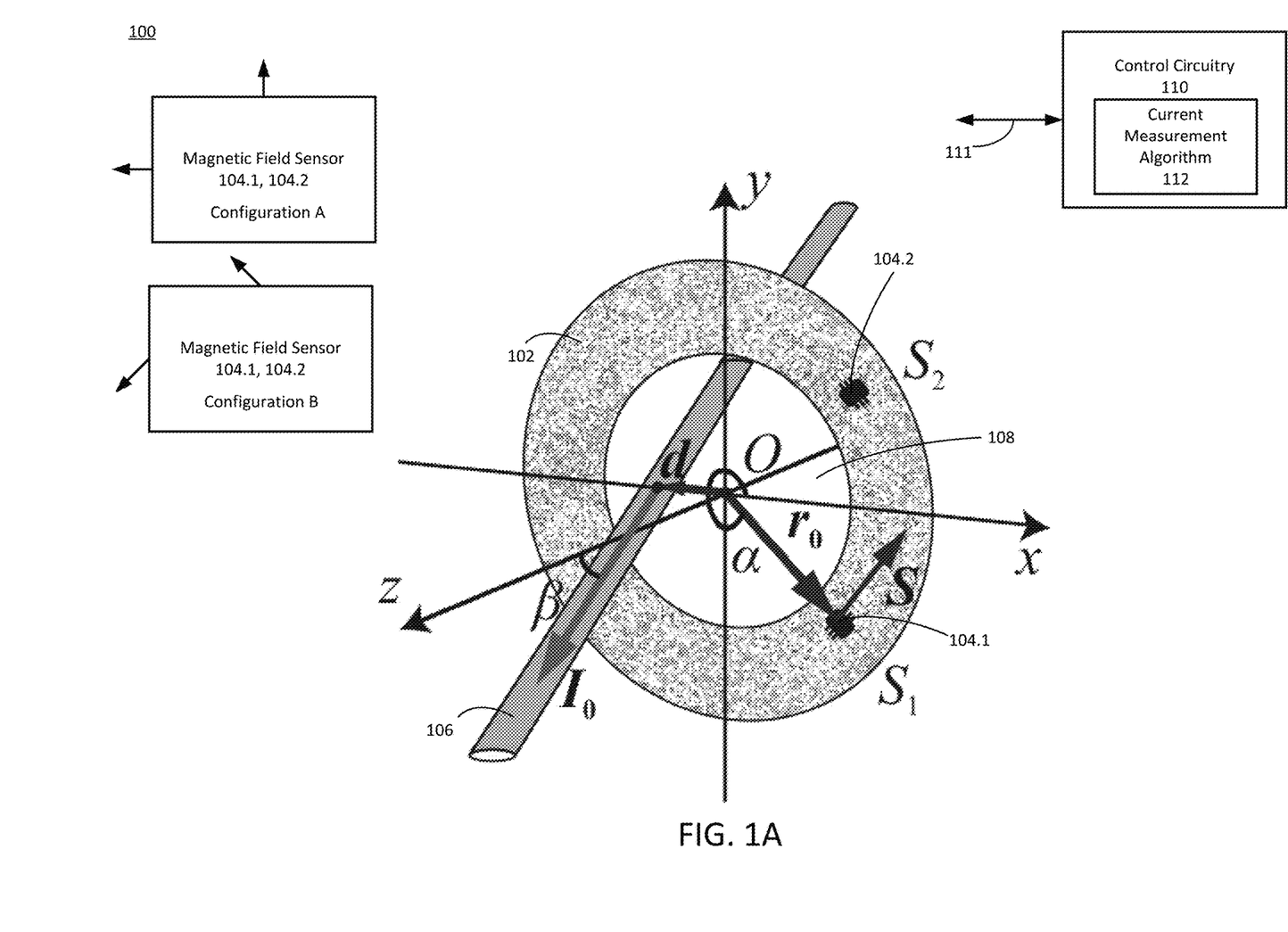
FIG. 1A illustrates an example current sensor configuration, in accordance with an embodiment of the disclosure.
Figure 2:
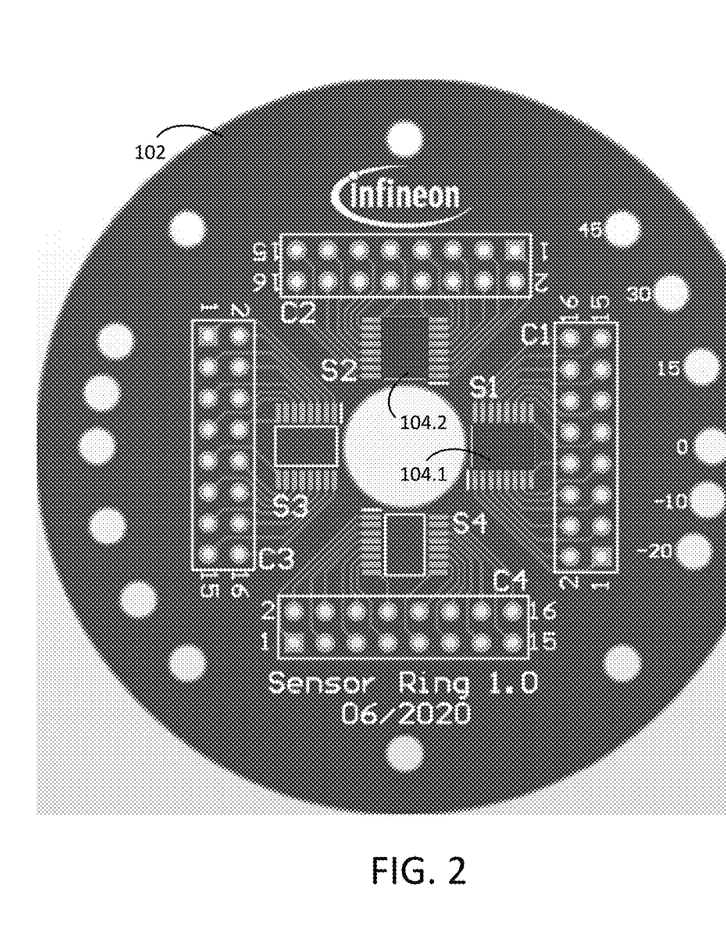
FIG. 2 illustrates an example substrate and current sensor arrangement, in accordance with an embodiment of the disclosure.

FIG. 1A illustrates an example current sensor configuration, in accordance with an embodiment of the disclosure. As shown in FIG. 1A, the current sensor 100 includes a substrate 102, onto which any suitable number N of magnetic field sensors 104.1-104.N may be mounted or otherwise disposed. The substrate 102 may be identified with a printed circuit board (PCB), as shown in FIG. 2, or any other suitable type of substrate, such as a dielectric substrate or an electrically insulating substrate, for instance. The substrate 102 may have any suitable size and/or shape to facilitate the magnetic field sensors 104 being positioned proximate to a conductor 106 (e.g. a wire) to measure the magnetic field generated by a current flowing through the conductor and, in turn, the amplitude $I_0$ of that current.

For instance, and as shown in FIG. 1A, the substrate 102 may be ring-shaped and include a cutout region 108, through which the conductor 106 is arranged to pass through the substrate 102. Although the substrate 102 and the cutout region 108 may have any suitable size and shape, the substrate 102 may be referred to herein having a central substrate axis for ease of explanation, and it is about this central substrate axis that the magnetic field sensors 104.1, 104.2 are distributed. The cutout region 108 is thus referred to herein as also being disposed about the central substrate axis. For instance, in the arrangement as shown in FIG. 1A, the substrate 102 has a central substrate axis that is aligned with the z-axis, about which the cutout region 108 of the substrate 102 is disposed and the magnetic field sensors 104.1, 104.2 are arranged a radial distance therefrom, as further discussed herein. In the Figures, the magnetic field sensors 104.1, 104.2 are shown as being disposed an equal radius about the central substrate axis; however, this is by way of example and not limitation, and the magnetic field sensors 104.1, 104.2 may be disposed on the substrate 102 an equal radius from the central substrate axis or unequal radii, in various embodiments.

Moreover, the conductor 106 is also identified with a conductor axis that, as shown in FIG. 1A, may deviate in terms of alignment from the central substrate axis. The deviation of the conductor axis may include an offset distance d in one of the x- or y-axes as shown in FIG. 1A. The conductor axis may also be unaligned with the z-axis such that the conductor 106 forms an angle β with the z-axis as shown in FIG. 1A. In the example shown in FIG. 1A, the angle β represents a tilting angle from the z-axis in the x-z plane when the offset distance d is in the x-axis direction. In other words, the angle β and the offset distance d are identified with the same plane. Thus, as another example the angle β may represent a tilting angle from the z-axis in the y-z plane when the offset distance d is in the y-axis direction.

The current sensor 100 may implement any suitable number of magnetic field sensors 104. Although two magnetic field sensors 104.1, 104.2, are shown in FIG. 1A, which are denoted in FIG. 1A at locations S1 and S2, this is for purposes of brevity and not by way of limitation. It is advantageous for reasons of cost, processing requirements, and processing speed to implement two magnetic field sensors 104.1, 104.2 in the manner as shown in FIG. 1A, although the embodiments described herein may implement any suitable number of additional magnetic field sensors.

Regardless of the number of the magnetic field sensors 104 that are implemented as part of the current sensor 100, the magnetic field sensors 104 may be implemented as any suitable type of magnetic field sensor that is capable of performing magnetic field measurements in at least two different directions or axes, which may in-plane with the magnetic field sensors 104, and thus in-plane with the substrate 102 onto which the magnetic field sensors 104 are mounted. The two different directions or axes of magnetic field measurements may be perpendicular to one another. Thus, the magnetic field measurements performed by the magnetic field sensors 104.1, 104.2 with respect to the magnetic field generated by the current carried through the conductor 106 may be alternately referred to herein as magnetic field component measurements.

In an embodiment, each of the magnetic field sensors 104 may include two individual magnetic sensor elements and be implemented as two-dimensional (2D) magnetic sensors. Such 2D magnetic field sensors are also known as linear angle sensors, because such magnetic field sensors are configured to measure a magnetic field vector (direction and magnitude). In various embodiments, the sensor elements included as part of each respective magnetic field sensor 104.1, 104.2 may be implemented as any suitable type of magnetic field sensor configured to measure a strength of a magnetic field component of the magnetic field generated by the current passing through the conductor 106. For example, the magnetic field sensor elements that form part of each magnetic field sensor 104.1, 104.2 may be implemented as Hall elements (e.g. vertical Hall probes and/or lateral Hall plates), magneto resistors (e.g. taking advantage of the anisotropic magnetoresistance (AMR), the giant magnetoresistance (GMR), or the tunnel magnetoresistance (TMR)), etc. The magnetic field sensors 104.1, 104.2 may be configured with at least two axes of magnetic sensitivity, each of which measuring a respective magnetic field component that is aligned with these magnetic sensitivity axes. Each of the magnetic field sensors 104.1, 104.2 may thus be configured to measure in-plane magnetic field components in two perpendicular directions.

In other words, each magnetic field sensor 104.1, 104.2 measures two perpendicular magnetic field components of the magnetic field generated by the current $I_0$ flowing through the conductor 106, as further discussed herein. The magnetic field components measured in this manner may have a particular direction and magnitude that depends upon the orientation and physical configuration of the magnetic sensor elements with respect to the generated magnetic field. In various embodiments, the magnetic field sensor elements included as part of each respective magnetic sensor 104 may generate an electrical signal, which represents each respective magnetic field component measurement, and which may be received and processed by the control circuitry 110 as further discussed herein to calculate the amplitude of the current passing through the conductor 106.

With reference to the 3D coordinate system as shown in FIG. 1A, for ease of explanation the substrate 102 is shown as being aligned with the x-y plane, and the origin O of the x-, y-, and z-axes intersect at the center of the cutout region 108, i.e. where the x-y plane intersects with the z-axis (or alternatively, the central substrate axis). Regardless of the number and/or type magnetic field sensors 104 that are implemented as part of the current sensor 100, embodiments include each of the magnetic field sensors 104 being disposed on the substrate 102 a predetermined distance (i.e. known a priori) from the central substrate axis. With reference to FIG. 1A, this may include each of the magnetic field sensors 104.1, 104.2 being disposed on the substrate 102 along a circumference of a circle that is centered about the central substrate axis, i.e. an equal radial distance r from the central substrate axis (in this example). Furthermore, for ease of explanation the substrate 102 may be referred to herein as including two in-plane substrate axes that are orthogonal to the central substrate axis. In the example as shown in FIG. 1A, as the substrate 102 is disposed within the x-y plane, the in-plane substrate axes are the x- and y-axes.

The magnetic field sensors 104.1, 104.2 may be disposed on the substrate 102 such that the two axes of magnetic sensitivity may be aligned with the desired direction of the magnetic field emitted by the magnetic field source that is to be measured. For instance, and as shown in FIG. 2, the substrate 102 may be configured as a PCB that accepts a variety of magnetic field sensors 104.1, 104.2 having the same orientation, pinout, and package size. The magnetic field sensors 104.1, 104.2 that may be populated for each current sensing application may be identical to one another, but differ among different current sensing applications with respect to having different axes of magnetic sensitivity.

Thus, and as further discussed below, the magnetic field components 104.1, 104.2 may measure magnetic field components of the magnetic field source generated via the current passing through the conductor 106 in any suitable direction that is aligned with these axes of sensitivity.

Figure 4A:
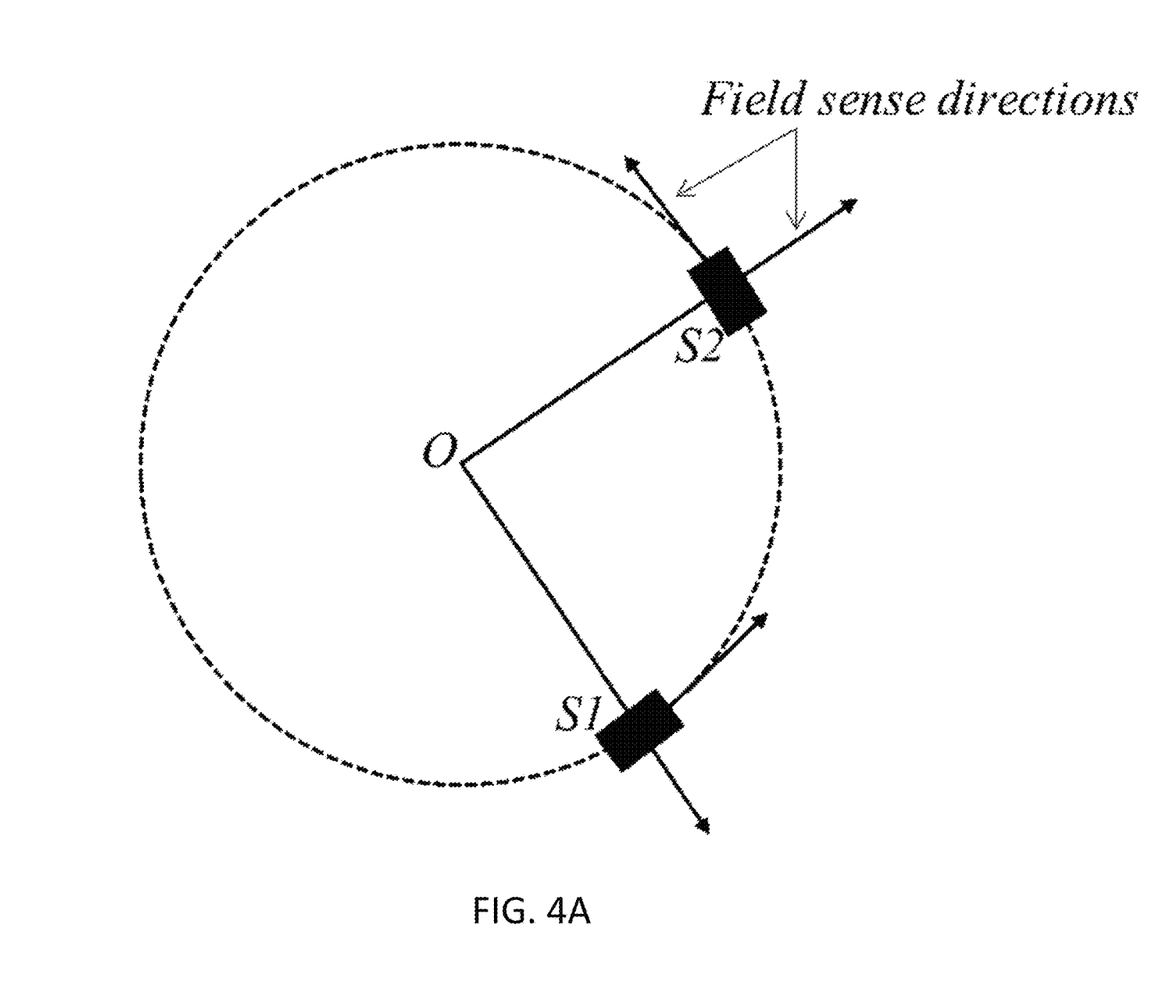
FIG. 4A illustrates one example alignment of magnetic field sensing directions with respect to a current sensor configuration, in accordance with an embodiment of the disclosure.

For instance, the magnetic field sensors 104.1, 104.2 may be configured in accordance with configuration A as shown in FIG. 1A and FIG. 4A. In accordance with such a configuration, the axis of sensitivity of the magnetic field sensors 104.1, 104.2 are perpendicular to one another and aligned with the sensor axes. Thus, when oriented on the substrate 102 as shown in FIG. 1A, the axes of sensitivity of the magnetic field sensors 104.1, 104.2 are aligned with the radial and tangential magnetic field components of the magnetic field generated via the current passing through the conductor 106. In other words, the radial and tangential directions are aligned with respect to the circle that is centered about the central substrate axis that has a circumference upon which the magnetic field sensors 104.1, 104.2 are disposed as noted above. Thus, in the configuration and orientation as shown in FIG. 1A, the magnetic field sensors 104.1, 104.2 each measure a radial and a tangential component of the magnetic field that is caused by the current flowing through the conductor 106.

As another example, the magnetic field sensors 104.1, 104.2 may be configured in accordance with a configuration B. In accordance with such a configuration, which is shown in further detail in FIG. 4B, the axis of sensitivity of the magnetic field sensors 104.1, 104.2 are also perpendicular to one another but rotated 45 degrees with respect to the sensor axes. Thus, when oriented on the substrate 102 as shown in FIG. 1A, the axes of sensitivity of the magnetic field sensors 104.1, 104.2 are rotated or offset 45 degrees from the radial vector of the circle (e.g. the circle having radius $r_0$ as shown in FIG. 1A) of the substrate 102 on which the magnetic field sensors 104.1, 104.2 are mounted. The two configurations as shown in FIGS. 1A, 1B, 4A, and 4B are provided by way of example and not limitation, and the embodiments described herein may implement magnetic field sensors 104 having axes of sensitivity that are aligned with the sensor axes or any suitable angular offset therefrom, in various embodiments.

In any event, the magnetic field sensor 104.1 may be disposed on the substrate 102 at any unknown angle $\alpha$ that is measured counterclockwise in this example with reference to the x-axis and within the x-y plane, as shown in FIG. 1A. Using this same direction of rotation, the magnetic field sensors 104.1, 104.2 may also be separated from one another by any suitable angle $\alpha+A$ in the plane of the substrate 102 (the x-y plane in this example). However, and as further discussed herein, an angle of separation between the magnetic field sensors 104.1, 104.2 of 90 degrees (i.e. A=90 degrees) may be particularly advantageous as some of the trigonometric calculations are simplified using a 90 degree angle of separation between the magnetic field sensors 104.1, 104.2.

The various calculations are further discussed herein with the assumption that the magnetic field sensors 104 are each configured to measure magnetic field components using the same two axes of sensitivity. In other words, regardless of the direction in three-dimensional space, each magnetic field sensor 104.1, 104.2 is configured to perform magnetic field measurements, and each of the magnetic field sensors 104.1, 104.2 may be assumed to have the same type of configuration in this regard (e.g. the magnetic field sensors 104.1, 104.2 may be identical or the same type of magnetic field sensors).

Again, the current sensor 100 is configured to measure the amplitude $I_0$ of the current flowing through the conductor 106 as a function of the measured magnetic field components generated by the current. This may be achieved in accordance with the embodiments discussed herein via use of the control circuitry 110, which may receive the magnetic field component measurements from each of the magnetic field sensors 104 to calculate the amplitude $I_0$ of the current flowing through the conductor 106. To do so, the control circuitry 110 may be implemented as any suitable type of hardware, software, or combinations of these, which function to enable the control circuitry 110 to receive the magnetic field component measurements from each of the magnetic field sensors 104, as further discussed herein.

The control circuitry 110 may be implemented as one of more processors and/or processing circuitry, and may execute computer-readable instructions to perform the various functions as discussed in further detail herein, which may include the execution of a current measurement algorithm 112. The current measurement algorithm 112 may thus represent any suitable type of computer-readable and executable instructions stored in a memory of the control circuitry 110, which are executed to perform current measurements from the magnetic field component measurements as discussed herein. The control circuitry 110 may additionally or alternatively be implemented as part of any suitable type of architecture and function in accordance with any suitable type of application that uses the calculated amplitude $I_0$ of the current flowing through the conductor 106 to perform specific functions. The control circuitry 110 may communicate with the magnetic field sensors 104 via a data interface 111 to receive the magnetic field component measurements from each of the magnetic field sensors 104 and/or to transmit data to the magnetic field sensors 104. The data interface 111 may thus represent any suitable number of data interfaces, each further comprising any suitable number and/or type of wires, buses, and/or respective terminals or pins of the control circuitry 110 to enable communications between the control circuitry 110 and each of the magnetic field sensors 104 in accordance with any suitable number and/or type of communication protocols. For example, the data interface 111 may include one or more wires that are coupled to a wired connector that is mated with a connector populated on the substrate 102 as shown in FIG. 2 as one or more of the 16-pin terminals C1, C2, C3, C4, etc. The data interface 111 may likewise be implemented as any suitable wireless communication and accompanying protocol between the between the control circuitry 110 and each of the magnetic field sensors 104.

Figure 1B:
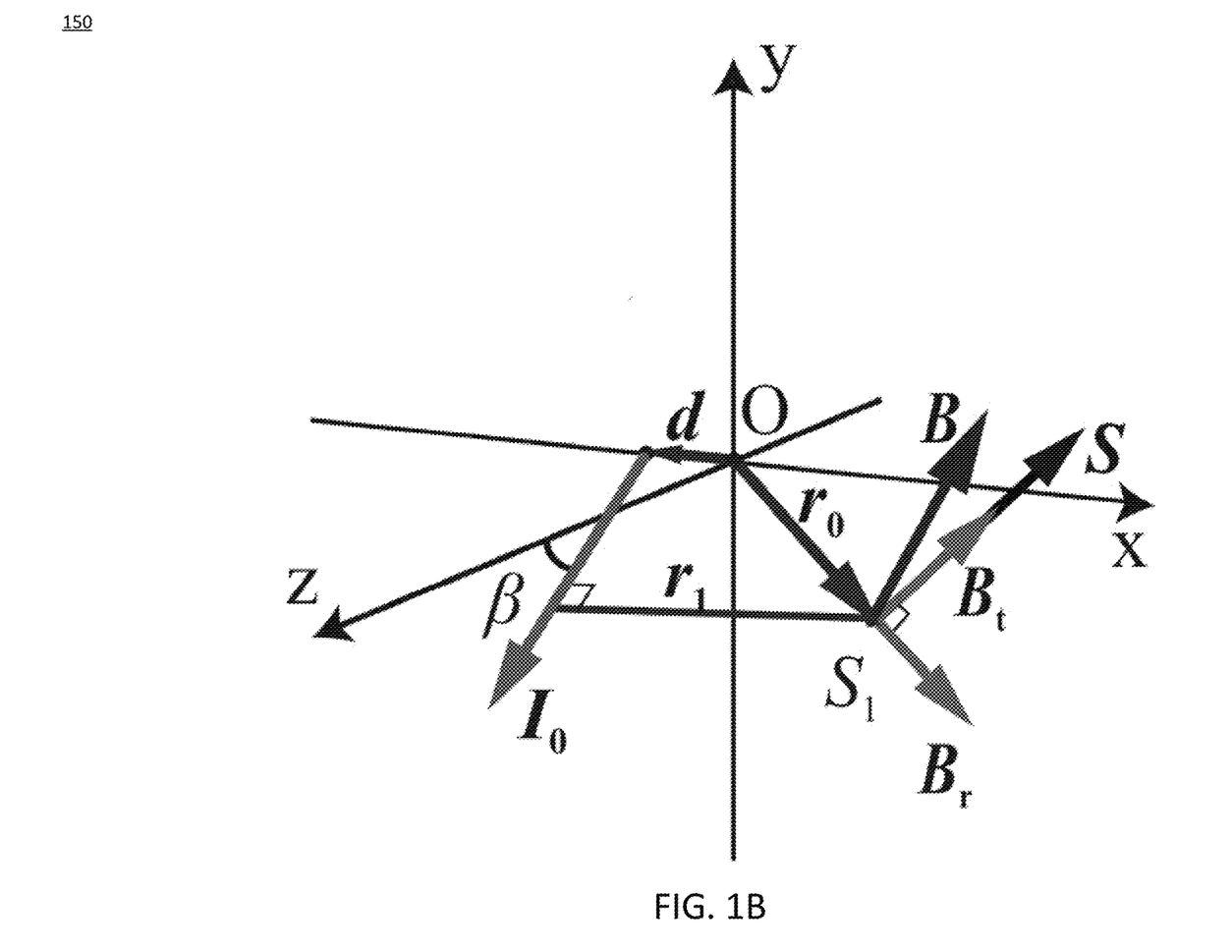
FIG. 1B illustrates additional detail of variables and magnetic field components identified with the current sensor configuration as shown in FIG. 1A, in accordance with an embodiment of the disclosure.

To better explain the manner in which the amplitude $I_0$ of the current flowing through the conductor 106 may be calculated by the control circuitry 110 using the magnetic field component measurements provided by the magnetic field sensors 104, the relationship between current and magnetic fields is now introduced with reference to FIG. 1B. FIG. 1B illustrates additional detail with respect to the trigonometric relationships and variables identified with the current sensor configuration 100 as shown in FIG. 1A.

In particular, the magnetic field generated by a long current carrying wire at any point in the vicinity of the wire can be described by Ampere's Law, which is represented in Equation 1 below as follows;

$$B = \frac{\mu}{2\pi}\frac{I_0}{r}, \qquad \text{Eqn. 1}$$

With reference to Eqn. 1 above, $I_0$ is also shown in FIG. 1B, and represents the current in a wire (e.g. the conductor 106), and r represents the shortest distance from a point on the conductor 106, which is depicted in FIG. 1B as $r_0$ for the scenario in which the conductor axis is aligned with the z-axis (not shown) and passing through O. The shortest distance is depicted as $r_1$ for the scenario in which the conductor axis is offset from the x-axis by a distance d and tilted/rotated from the z-axis by the angle β as shown in FIGS. 1A-1B.

By knowing the distance (e.g. $r_0$ or $r_1$) and the measured magnetic field strength at a point in three-dimensional space, the amplitude $I_0$ of the current flowing through the conductor 106 can be calculated. However, and of particular importance with respect to the embodiments as described herein, when the axis of the conductor 106 is no longer aligned with the z-axis (e.g. due to movement after installation or other extraneous factors), then the distance $r_1$ may not be known. In such a case, a magnetic field measurement may still be performed adjacent to the conductor 106, but Eqn. 1 cannot be used for the current amplitude calculation without introducing significant inaccuracy, as $r_0 \neq r_1$.

In other words, conventional current sensors are only capable of accurately calculating current when the distance r is known, which may be the case when the conductor axis is at a defined position with respect to a respective one of the magnetic field sensors 104.1, 104.2, and this relationship does not deviate over time. However, as a practical matter, the position of the conductor axis and the central substrate axis may change over time, and thus the distance r from the conductor 106 and the magnetic field sensors 104.1, 104.2 may not readily be known as magnetic field measurements are made. In such a case, the amplitude of the conductor current cannot be accurately determined using conventional current sensor solutions that rely on magnetic field measurements adjacent to a current carrying conductor.

Thus, the embodiments described herein address this issue by implementing at least two of the magnetic field sensors 104.1, 104.2 to enable the control circuitry 110 to calculate, independently of the alignment of the conductor axis with the substrate axis, the amplitude of the current flowing through the conductor 106. This calculation may be made, as further discussed herein, using the (at least) four magnetic field component measurements provided by the (at least) two magnetic field sensors 104.1, 104.2. It is noted that the embodiments described herein may calculate the amplitude $I_0$ of the current flowing through the conductor 106 even when the current conductor is offset a distance d from central substrate axis and rotated from the z-axis in the y-z or the x-z plane, as noted above. In other words, the control circuitry 110 may calculate the amplitude $I_0$ of the current flowing through the conductor 106 independently of the conductor axis being rotated or offset with respect to the substrate axis.

However, the calculations in accordance with the embodiments discussed herein assume that the conductor 106 is offset in one of the x- or y-direction from the central substrate axis, but not both directions. That is, the variable d may be addressed by way of the number of magnetic field component measurements acquired via at least two 2D magnetic field sensors 104.1, 104.2, as discussed herein. Furthermore, this may be accomplished by leveraging the combination of the four magnetic field components that are measured along a circular path (i.e. the magnetic field sensors 104.1, 104.2 are disposed a radial distance (which again may be equal or unequal from one another) from the central substrate axis), which enables the precise calculation of the amplitude $I_0$ of the current flowing through the conductor 106 wire without knowledge of the distance r as noted above. However, if the conductor axis becomes offset from the central substrate axis in both the x- and y-directions, then an additional variable will be introduced that cannot be accounted for using the techniques as discussed herein. Nonetheless, the embodiments described herein recognize this tradeoff by acknowledging that for most applications the alignment of the conductor axis with the central substrate axis may be sufficiently maintained such that a deviation in only one of the x- or y-directions is likely to occur.

Again, to ensure an adequate amount of data is collected to perform the current amplitude calculations, each of the magnetic field sensors 104.1, 104.2 measures two magnetic field components that are in-plane with the substrate 102 (e.g. the x-y plane) and perpendicular to one another. This is further illustrated with reference to the magnetic field sensor 104.1 as shown in FIG. 1B, which is depicted at location S1. With continued reference to FIG. 1B, each of the magnetic field sensors 104.1, 104.2, may be oriented with respect to the central substrate axis of the current sensor 100 such that each magnetic field sensor 104.1, 104.2 measures a radial ($B_r$) and tangential ($B_t$) magnetic field component of the magnetic field (B) generated by the conductor 106. That is, and as shown in FIG. 1B, the magnetic field B lies in plane perpendicular to conductor axis, regardless of the tilting angle β. Therefore, each magnetic field sensor 104.1, 104.2 measures two perpendicular magnetic field components of the magnetic field B vector as shown by the trigonometric representation in FIG. 1B with respect to the magnetic field sensor 104.1. It is noted that the magnetic field B may have all three x, y, and z components at any or all positions on the substrate 102. However, in the present embodiments, each magnetic field sensor 104.1, 104.2 measures the magnetic field components Bx and By at each respective location. Although the magnetic field component Bz will be different at position S1 versus position S2, the value of the magnetic field component Bz is not required for the proposed solutions in accordance with the embodiments discussed herein.

Figure 4B:
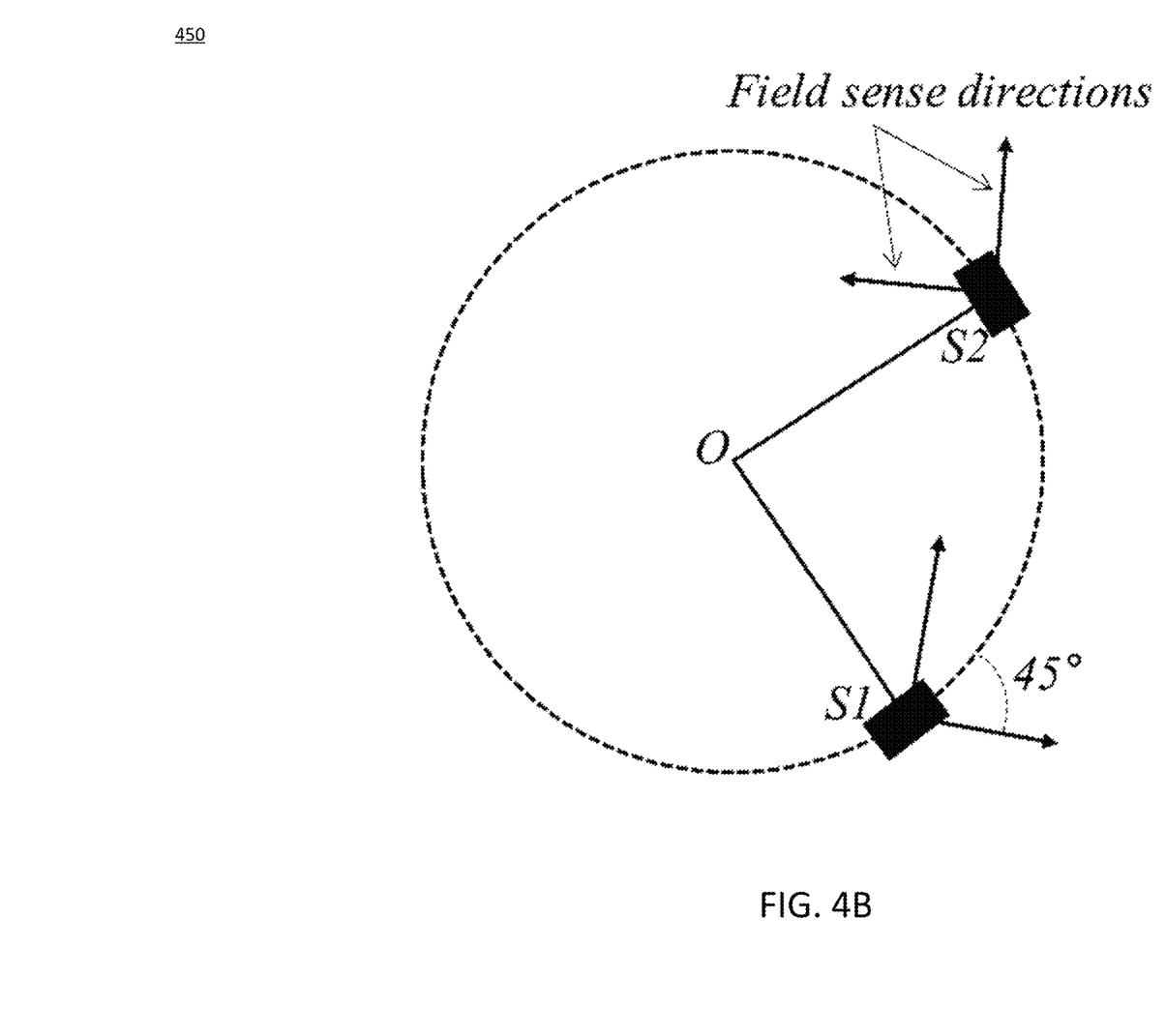
FIG. 4B illustrates another example alignment of magnetic field sensing directions with respect to a current sensor configuration, in accordance with an embodiment of the disclosure.

Again, the specific orientation of the magnetic field components measured by each magnetic field sensor 104.1, 104.2 may be any two directions that are perpendicular to one another, and need not be the radial and tangential directions as shown in FIG. 1B. For example, the measured magnetic field components may be rotated from the radial and tangential directions as shown in FIG. 1B by 45 degrees if the magnetic field sensors are implemented in accordance with the configuration B as shown in FIG. 1A and FIG. 4B, or any other suitable direction that may deviate from the radial and tangential directions. In any event, each magnetic field sensor 104 measures two perpendicular and in-plane magnetic field components of the magnetic field generated by the current flowing through the conductor 106, as further discussed herein.

Regardless of the particular direction of the magnetic field components that are measured, the magnetic field sensors 104.1, 104.2 may be oriented along a common circumference of the substrate 102 as shown in FIG. 1A, i.e. the same radial distance from the central substrate axis. Alternatively, the magnetic field sensors 104.1, 104.2 may be oriented along the circumference of circles having different radii measured from the central substrate axis. In any event, the distance (i.e. the radius) from each of the magnetic field sensors 104.1, 104.2 and the central substrate axis is assumed to be a known value. Again, and regardless of the radial distance from the central substrate axis each magnetic field sensor 1004.1, 104.2 is disposed, the magnetic field sensors 104.1, 104.2 may be offset from one another at angular coordinates of α and α+A degrees, with A being 90 degrees or any suitable angular offset.

With continued reference to FIG. 1B, and using the magnetic field sensor configuration A as shown in FIGS. 1A and 4A as an example, each of the magnetic field sensors 104.1, 104.2 measures two perpendicular magnetic field components $B_r$ and $B_t$ of the magnetic field B generated by the conductor 106. Furthermore, and as noted above, the total magnetic field B is represented with three magnetic field components $B_r$, $B_t$ and $Bz$, with $(B_r)^2+(B_t)^2 \leq B^2$.

The magnetic field components $B_r$ and $B_t$ are discussed herein and represent the radial and tangential magnetic field components, respectively, of the magnetic field B. For ease of explanation, the measured radial and tangential magnetic field components may be mapped to the Bx and By components as discussed herein using known trigonometric properties. Thus, the Bx and By components of the magnetic field B as discussed herein may be translated to the radial and tangential components of the magnetic field measured by the sensors 104.1, 104.2 in accordance with these trigonometric properties.

Thus, the magnetic field component $B_t$ of the magnetic field B along the length of each the magnetic field sensor 104.1, 104.2 (i.e. along the direction S as shown in FIG. 1B using the sensor configuration A) is represented in Equation 2 below as follows:

$$B_t = \mu \frac{I_0 \times r_1}{2\pi r_1^2} \cdot \hat{S}, \quad \text{Eqn. 2}$$

where $\hat{S}$ represents the unit vector in the direction of S.

The magnetic field component $B_r$ of the magnetic field B that is perpendicular to the direction S along a direction $r_0$ is represented in Equation 3 below as follows:

$$B_r = \mu \frac{I_0 \times r_1}{2\pi r_1^2} \cdot \widehat{r_0}, \quad \text{Eqn. 3}$$

where $\widehat{r_0}$ represents the unit vector in the direction of $r_0$.

Thus, for the magnetic field sensor 104.1 (the sensor at location S1 as shown in FIG. 1B) at the angular position of α, the measured magnetic field components may be represented in Equations 4 and 5 below as follows:

$$B_1 = B_{1t} = \frac{\mu I_0}{2\pi} \frac{\cos \beta \ (r_0 - d \cos \alpha)}{\cos^2 \beta \ (r_0 \cos \alpha - d)^2 + r_0^2 \sin^2 \alpha}, \text{ and} \quad \text{Eqn. 4}$$

$$B_2 = B_{1r} = \frac{\mu I_0}{2\pi} \frac{-d \cos \beta \sin \alpha}{\cos^2 \beta \ (r_0 \cos \alpha - d)^2 + r_0^2 \sin^2 \alpha} \quad \text{Eqn. 5}$$

For the magnetic field sensor 104.2 at the angular position of α+A, with A=90 degrees in this example, the measured magnetic field components may be represented in Equations 6 and 7 below as follows:

$$B_3 = B_{2t} = \frac{\mu I_0}{2\pi} \frac{\cos \beta \ (r_0 + d \sin(\alpha))}{\cos^2 \beta \ (r_0 \sin(\alpha) + d)^2 + r_0^2 \cos^2(\alpha)}, \text{ and} \quad \text{Eqn. 6}$$

-continued $$B_4 = B_{2r} = \frac{\mu I_0}{2\pi} \frac{-d \cos \beta \cos(\alpha)}{\cos^2 \beta \ (r_0 \sin(\alpha) + d)^2 + r_0^2 \cos^2(\alpha)}. \quad \text{Eqn. 7}$$

In the Equations 4-7 above, $r_0$ represents a predetermined radial distance (i.e. a known distance) between the central substrate axis and each of the magnetic field sensors 104.1, 104.2. That is, $r_0$ represents the equal radial distance (in this example) from the central substrate axis to each of the magnetic field sensors 104.1, 104.2. Furthermore, $I_0$ represents the amplitude of the current passing through the conductor 106 that is to be measured. The Equations 4-7 also include three other unknown variables: the angle α, the tilt angle β, and the offset distance d as shown in FIGS. 1A-1B. However, as the Equations 4-7 represent four independent equations and together include 4 unknown variables (i.e. $I_0$, d, α, and β), and thus each of these variables may be solved mathematically as part of the current measurement algorithm 112 executed by the control circuitry 110. Once the angle α, the tilt angle β, and the offset distance d are solved in this way, the control circuitry 110 may calculate the amplitude $I_0$ of the current passing through the conductor 106 by evaluating Equation 8, which may be derived from the Equations 4-7 and expressed in below in terms of the magnetic field component measurement $B_4=B_{2r}$ as follows:

$$I_0 = \frac{2\pi B_4}{\mu} \frac{\cos^2 \beta \ (r_0 \sin \alpha + d)^2 + r_0^2 \cos^2 \alpha}{-d \cos \beta \cos \alpha}. \quad \text{Eqn. 8}$$

Although the magnetic field component measurement $B_4$ is used in Eqn. 8 above to calculate the current amplitude $I_0$ passing through the conductor 106, this is by way of example and not limitation. In other embodiments, the Equations 4-7 may be evaluated mathematically to alternatively express the current amplitude $I_0$ as a function of any one of the magnetic field component measurements $B_1$, $B_2$, or $B_3$, and any one of which may then be evaluated to calculate the current amplitude $I_0$ passing through the conductor 106. Alternatively, the current amplitude $I_0$ passing through the conductor 106 may be evaluated for each one of the magnetic field component measurements $B_1$, $B_2$, $B_3$, and $B_4$, and then a "final" current amplitude $I_0$ may be calculated as a median or mean of each of these calculations.

Thus, the control circuitry 110 may execute the current measurement algorithm 112 that operates by using the magnetic field component measurements received via each of the magnetic field sensors 104.1, 104.2 (as well as additional magnetic field sensors 104.3, 104.4, etc. if present) to calculate the amplitude $I_0$ of the current passing through the conductor 106 using the Equations 4-8. The amplitude $I_0$ may be measured by the control circuitry 110 using the aforementioned calculations in accordance with this current measurement algorithm 112, which may be implemented, for instance, via execution of computer-readable instructions stored in a memory (e.g. integrated in the control circuitry 110). It will be understood that the Equations discussed herein that may be utilized by the control circuitry 110 to perform the current measurements may be further modified based upon the particular implementation. For instance, the Equations 4-8 may be further modified with respect to the direction d of the offset (e.g. in the y-direction as opposed to the x-direction) and for the 45-degree configuration B as shown in FIG. 1A and FIG. 4B. Such modifications to the Equations are within the scope of the embodiments as discussed herein.

Furthermore, it is noted that the above equations may be derived for any known angle of separation A between the magnetic field sensors 104. However, the use of a 90° angle of separation in the example above is particularly useful, as the trigonometry in Equations 4-8 is simplified in this scenario and these Equations may thus be solvable analytically. The solutions that are simplified in this manner may be particularly useful to further reduce the required computational power of the control circuitry 110 to execute the current measurement algorithm 112. This may enable the control circuitry 100 to be implemented as any suitable type of low-cost microcontroller, for instance.

Figure 3A:
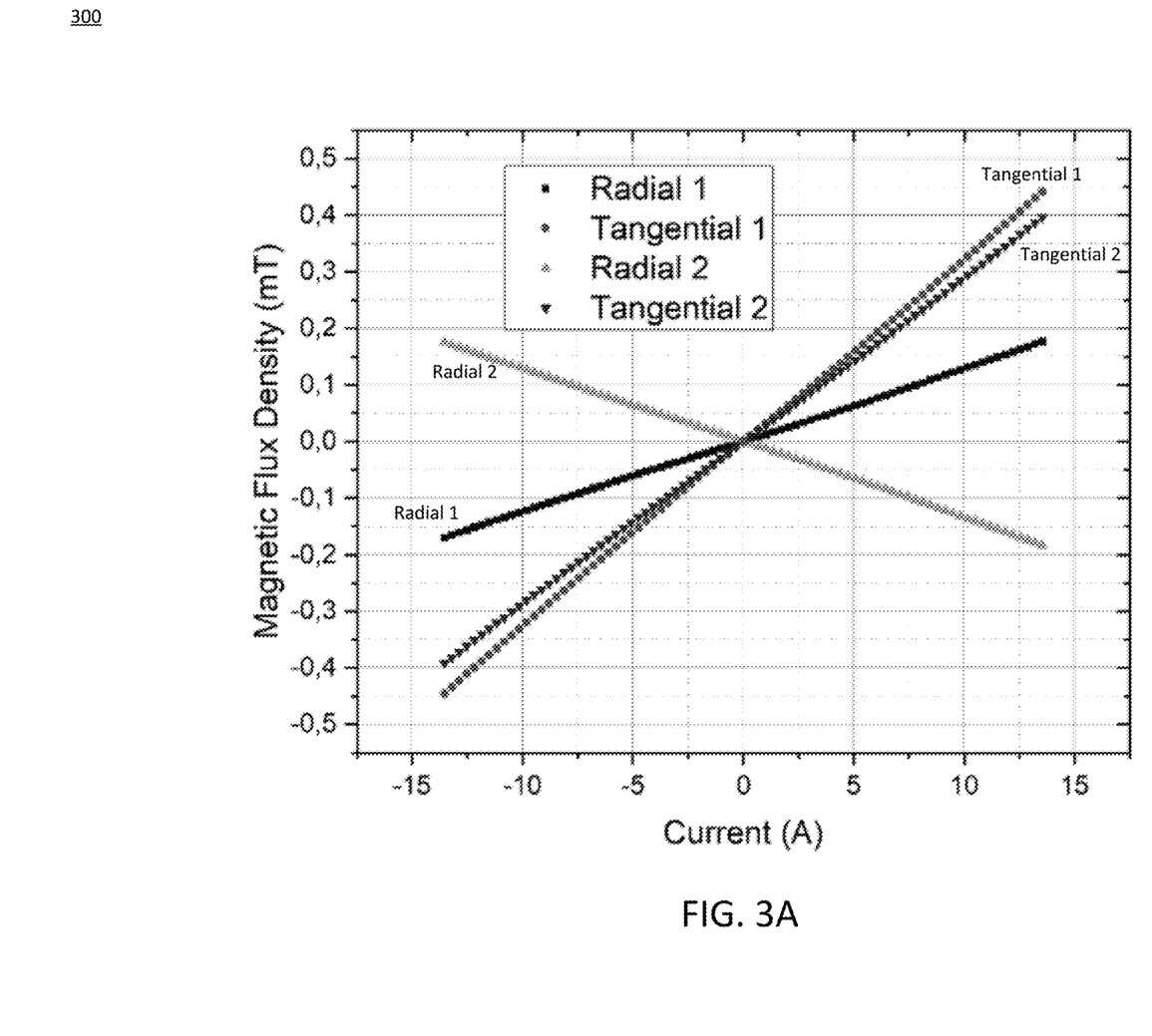
FIG. 3A illustrates an example sensor response illustrating measured magnetic field components versus current amplitude, in accordance with an embodiment of the disclosure.

FIG. 3A illustrates an example magnetic field sensor response graph illustrating measured magnetic field components versus current amplitude, in accordance with an embodiment of the disclosure. The graph as shown in FIG. 3A is identified with the use of the magnetic field sensors 104.1, 104.2 as shown in FIGS. 1A-1B. The graph as shown in FIG. 3A illustrates the magnetic field components measured by the magnetic field sensors 104.1, 104.2 over a range of current amplitudes. Thus, a vertical line drawn through the graph as shown in FIG. 3A identifies a set of four (two from each of the magnetic field sensors 104.1, 104.2) magnetic field component measurements corresponding to a particular current amplitude $I_0$.

In an embodiment, the control circuitry 110 may store or otherwise access data (e.g. a lookup table (LUT)) that correlates the values of each of the magnetic field sensor measurements to a corresponding current amplitude value. Thus, the control circuitry 110 may correlate a set of magnetic field component measurements with the stored values to identify the corresponding current amplitude $I_0$. This correlation may implement any suitable type of best fit analysis to match or compensate for differences between the measured and stored magnetic field component measurements to make this determination, such as using linear interpolation, selecting a set of stored magnetic field component measurements that satisfy a least squares analysis, etc. The use of such a technique may be particularly useful when some accuracy may be sacrificed to enable a further simplified and/or faster calculation process to determine the current amplitude $I_0$.

Figure 3B:
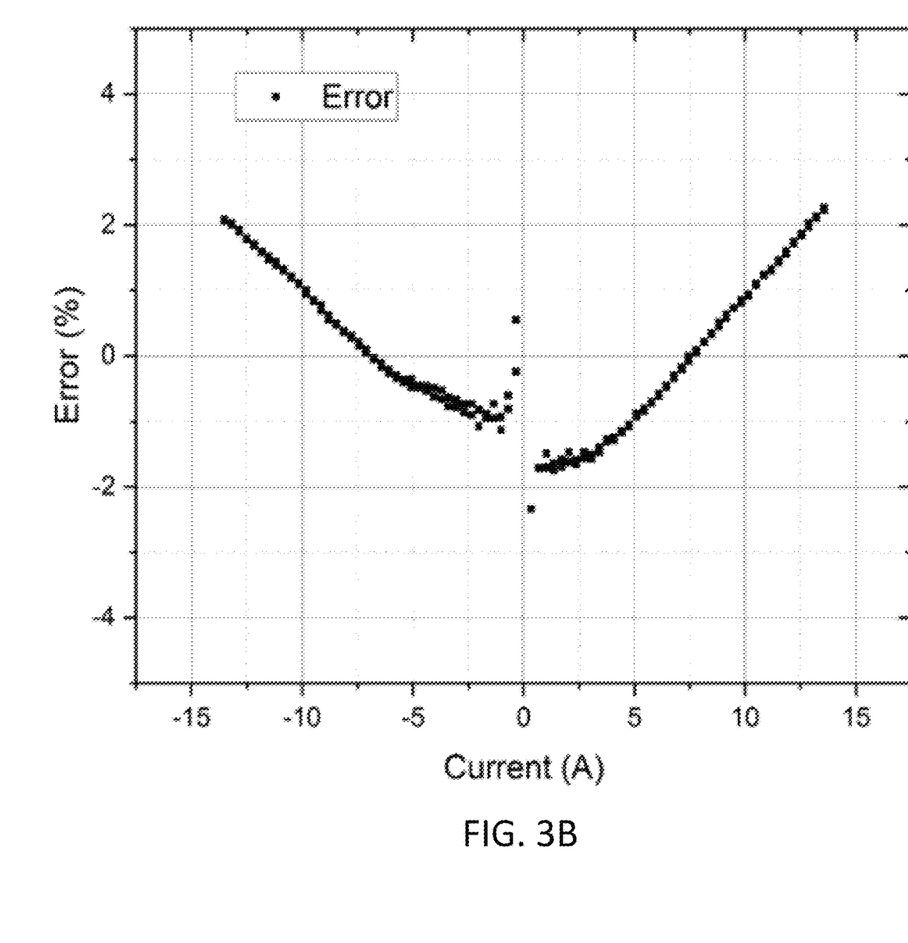
FIG. 3B illustrates an example graph illustrating a percentage error between an applied and measured current, in accordance with an embodiment of the disclosure.

FIG. 3B illustrates an example graph illustrating a percentage error between the applied and measured current, in accordance with an embodiment of the disclosure. The graph as shown in FIG. 3B demonstrates the percentage error between an applied (i.e. known) current and the measured current using the above described current measurement algorithm 112, which demonstrates the capability of the sensing concept as shown and described herein. The deviation in the measured current originates from the accuracy of the magnetic field sensors 104, which can be interpreted as "bending" the different measured magnetic field components. Ideally, each of the four measured magnetic field components should be linear with respect to the current applied in the conductor 106.

As discussed herein, the current measurement embodiments may utilize as few as two magnetic field sensors 104, which is in contrast to conventionally-implemented current measurement techniques. However, the total number of magnetic field sensors 104 may be increased to any suitable number, as noted above, and which may be implemented to increase the overall accuracy and/or to introduce redundancy for some applications. For example, FIG. 2 illustrates an example implementation of the current sensor 100 as shown in FIG. 1A, which includes space to mount two additional magnetic field sensors 104.3, 104.4 to the locations identified with 'S3' and 'S4' (not populated in FIG. 2). The arrangement of these two additional magnetic field sensors 104.3, 140.4 may be identical or substantially similar as the arrangement of the magnetic field sensors 104.1, 104.2. That is, regardless of the number of magnetic field sensors 104 that are implemented, in the present embodiments each magnetic field sensor 104 is positioned at a known radial distance r from the central substrate axis, which may be equal to one another as shown in FIG. 2 (i.e. along a circumference of a circle that is centered about the substrate axis) or be an unequal radial distance (not shown). Further in accordance with the present embodiments and as shown in FIG. 2, regardless of the number of the magnetic field sensors 104 that are implemented, each magnetic field sensor is also disposed at a different angular position with respect to one another, and may be disposed symmetrically about the central substrate axis (e.g. 360 degrees/N, with N being the number of the magnetic field sensors 104).

Further, in accordance with the present embodiments, regardless of the number of the magnetic field sensors 104 that are implemented, the calculations used to determine the amplitude of the current passing through the conductor 106 may be performed in terms of groupings (e.g. two or more) of the of the magnetic field sensors 104. In the example configuration shown in FIG. 2, the signals representing the measured magnetic field components measured by the magnetic field sensors 104.1, and 104.2 may be processed via the control circuitry 110 to obtain a first current amplitude measurement, as discussed herein. Then, the signals representing the measured magnetic field components measured by the additional magnetic sensors 104.3. 104.4 may be processed in the same manner via the control circuitry 110 to obtain a second current amplitude measurement, as discussed herein. The second current amplitude measurement may be used to provide measurement redundancy for some applications. Alternatively, the current amplitude may be measured by averaging each of the first and the second (or more) current measurements obtained in this way to reduce measurement errors.

Additional modifications to the examples discussed above may include the use of the magnetic field sensors 104 having a different axis of sensitivity for measuring magnetic field components. Again, the configuration A is shown in further detail in FIG. 4A, which illustrates an example alignment of magnetic field sensing directions with respect to a current sensor configuration, in accordance with an embodiment of the disclosure. The configuration as shown in FIG. 4A corresponds to the current sensor 100 as shown in FIG. 1A and the configuration A as shown in FIG. 1A, with the orientation of the measured magnetic field components corresponding to the radial and tangential components as discussed herein with respect to FIGS. 1A and 1B.

However, and as noted above, the magnetic field sensors 104 may have varying configurations, such as the configuration B as shown and discussed herein with reference to FIG. 1A. Thus, and using the configuration B in an example, the magnetic field sensors 104 may be configured such that the sensitive axis of each magnetic sensors 104.1, 104.2 are rotated or offset 45 degrees from the radial vector of the circle (e.g. the circle having radius $r_0$ as shown in FIG. 1A) of the substrate 102 on which the magnetic field sensors 104.1, 104.2 are mounted, i.e. offset or rotated from the directions as described for configuration A. The result of implementing the magnetic field sensors 104.1, 104.2 having the configuration B as part of the current sensor 100 as shown in FIG. 1A is shown in FIG. 4B. It is noted that Equation 1 demonstrates that, in an ideal case when the conductor 106 is at position O (i.e. aligned with the central substrate axis), the magnetic field B is circular and at a distance r, and thus has only tangential magnetic field components. However, when the conductor 106 is displaced from the center O (i.e. unaligned with the central substrate axis), a radial field appears as the ring circumference and the circular magnetic field by the conductor 106 are no longer concentric. As a result, each magnetic field sensor 104.1, 104.2 in an alternate configuration as shown in FIG. 4B will generate two perpendicular magnetic field component measurements, with each indicating magnetic field component measurements of nearly equal amplitudes as one another. As a result, the configuration B as illustrated in FIG. 4B may be implemented to advantageously reduce measurement and numerical calculation errors.

EXAMPLES

The techniques of this disclosure may also be described in the following examples.

Example 1. A device for measuring current flowing through a conductor having a conductor axis, comprising: a substrate having a cutout region disposed about a central substrate axis; a first two-dimensional (2D) magnetic field sensor disposed on the substrate and configured to measure a first magnetic field component and a second magnetic field component of a magnetic field generated by the current flowing through the conductor when the conductor is arranged to pass through the substrate via the cutout region, the first magnetic field component and the second magnetic field component being perpendicular to one another; a second two-dimensional (2D) magnetic field sensor disposed on the substrate and configured to measure a third magnetic field component and a fourth magnetic field component of the magnetic field generated by the current flowing through the conductor when the conductor is arranged to pass through the substrate via the cutout region, the third magnetic field component and the fourth magnetic field component being perpendicular to one another; and control circuitry configured to calculate, independently of an alignment of the conductor axis with the central substrate axis, an amplitude of the current flowing through the conductor using the first magnetic field component, the second magnetic field component, the third magnetic field component, and the fourth magnetic field component.

Example 2. The device of Example 1, wherein the first 2D magnetic field sensor and the second 2D magnetic field sensor are disposed on the substrate at an equal distance from the central substrate axis.

Example 3. The device of any combination of Examples 1-2, wherein the first 2D magnetic field sensor and the second 2D magnetic field sensor are disposed on the substrate along a circumference of a circle that is centered about the central substrate axis.

Example 4. The device of any combination of Examples 1-3, wherein the first 2D magnetic field sensor and the second 2D magnetic field sensor separated from one another by an angle of 90 degrees.

Example 5. The device of any combination of Examples 1-4, wherein the first magnetic field component, the second magnetic field component, the third magnetic field component, and the fourth magnetic field component are each in-plane with the substrate.

Example 6. The device of any combination of Examples 1-5, wherein the first 2D magnetic field sensor and the second 2D magnetic field sensor are arranged such that (i) the first magnetic field component and the third magnetic field component correspond to a tangential magnetic field component aligned with a tangential direction of the circle, and (ii) the second magnetic field component and the fourth magnetic field component correspond to a radial magnetic field component aligned with a radial direction of the circle.

Example 7. The device of any combination of Examples 1-6, wherein the first 2D magnetic field sensor and the second 2D magnetic field sensor are arranged such that (i) the first magnetic field component and the third magnetic field component correspond to an offset tangential magnetic field component that is rotated by a first angle from a tangential direction of the circle, and (ii) the second magnetic field component and the fourth magnetic field component correspond to an offset radial magnetic field component that is rotated by a second angle from a radial direction of the circle.

Example 8. The device of any combination of Examples 1-7, wherein the control circuitry is configured to calculate the amplitude of the current flowing through the conductor independently of the conductor axis being rotated or offset with respect to the central substrate axis.

Example 9. The device of any combination of Examples 1-8, further comprising: a third two-dimensional (2D) magnetic field sensor disposed on the substrate and configured to measure a fifth magnetic field component and a sixth magnetic field component of a magnetic field generated by the current flowing through the conductor when the conductor is arranged to pass through the substrate via the cutout region, the fifth magnetic field component and the sixth magnetic field component being perpendicular to one another; a fourth two-dimensional (2D) magnetic field sensor disposed on the substrate and configured to measure a seventh magnetic field component and an eighth magnetic field component of the magnetic field generated by the current flowing through the conductor when the conductor is arranged to pass through the substrate via the cutout region, the seventh magnetic field component and the eighth magnetic field component being perpendicular to one another, wherein the first 2D magnetic field sensor, the second 2D magnetic field sensor, the third 2D magnetic field sensor, and the fourth 2D magnetic field sensor are disposed on the substrate along a circumference of a circle that is centered about the central substrate axis, and wherein the first 2D magnetic field sensor, the second 2D magnetic field sensor, the third 2D magnetic field sensor, and the fourth 2D magnetic field sensor are separated from one another by an angle of 90 degrees.

Example 10. The device of any combination of Examples 1-9, wherein the control circuitry is configured to calculate the amplitude of the current flowing through the conductor by: using the first magnetic field component, the second magnetic field component, the third magnetic field component, and the second magnetic field component to calculate a first current amplitude; using the fifth magnetic field component, the sixth magnetic field component, the seventh magnetic field component, and the eighth magnetic field component to calculate a second current amplitude; calculating the amplitude of the current flowing through the conductor by averaging the first current amplitude and the second current amplitude.

Example 11. A method for measuring current flowing through a conductor having a conductor axis, comprising: measuring, via a first two-dimensional (2D) magnetic field sensor arranged on a substrate having a cutout region disposed about a central substrate axis, a first magnetic field component and a second magnetic field component of a magnetic field generated by the current flowing through the conductor when the conductor is arranged to pass through the substrate via the cutout region, the first magnetic field component and the second magnetic field component being perpendicular to one another; measuring, via a second two-dimensional (2D) magnetic field sensor disposed on the substrate, a third magnetic field component and a fourth magnetic field component of the magnetic field generated by the current flowing through the conductor when the conductor is arranged to pass through the substrate via the cutout region, the third magnetic field component and the fourth magnetic field component being perpendicular to one another; and calculating, independently of an alignment of the conductor axis with the central substrate axis, an amplitude of the current flowing through the conductor using the first magnetic field component, the second magnetic field component, the third magnetic field component, and the fourth magnetic field component.

Example 12. The method of Example 11, wherein the first 2D magnetic field sensor and the second 2D magnetic field sensor are disposed on the substrate at an equal distance from the central substrate axis.

Example 13. The method of any combination of Examples 11-12, wherein the first 2D magnetic field sensor and the second 2D magnetic field sensor are disposed on the substrate along a circumference of a circle that is centered about the central substrate axis.

Example 14. The method of any combination of Examples 11-13, wherein the first 2D magnetic field sensor and the second 2D magnetic field sensor separated from one another by an angle of 90 degrees.

Example 15. The method of any combination of Examples 11-14, wherein the first magnetic field component, the second magnetic field component, the third magnetic field component, and the fourth magnetic field component are in-plane with the substrate.

Example 16. The method of any combination of Examples 11-15, wherein the first 2D magnetic field sensor and the second 2D magnetic field sensor are arranged such that (i) the first magnetic field component and the third magnetic field component correspond to a tangential magnetic field component aligned with a tangential direction of the circle, and (ii) the second magnetic field component and the fourth magnetic field component correspond to a radial magnetic field component aligned with a radial direction of the circle.

Example 17. The method of any combination of Examples 11-16, wherein the first 2D magnetic field sensor and the second 2D magnetic field sensor are arranged such that (i) the first magnetic field component and the third magnetic field component correspond to an offset tangential magnetic field component that is rotated by a first angle from a tangential direction of the circle, and (ii) the second magnetic field component and the fourth magnetic field component correspond to an offset radial magnetic field component that is rotated by a second angle from a radial direction of the circle.

Example 18. The method of any combination of Examples 11-17, wherein the act of calculating the amplitude of the current flowing through the conductor comprises calculating the amplitude of the current flowing through the conductor independently of the conductor axis being rotated or offset with respect to the central substrate axis.

Example 19. The method of any combination of Examples 11-18, further comprising: measuring, via a third two-dimensional (2D) magnetic field sensor disposed on the substrate, a fifth magnetic field component and a sixth magnetic field component of a magnetic field generated by the current flowing through the conductor when the conductor is arranged to pass through the substrate via the cutout region, the fifth magnetic field component and the sixth magnetic field component being perpendicular to one another; measuring, via a fourth two-dimensional (2D) magnetic field sensor disposed on the substrate, a seventh magnetic field component and an eighth magnetic field component of the magnetic field generated by the current flowing through the conductor when the conductor is arranged to pass through the substrate via the cutout region, the seventh magnetic field component and the eighth magnetic field component being perpendicular to one another, wherein the first 2D magnetic field sensor, the second 2D magnetic field sensor, the third 2D magnetic field sensor, and the fourth 2D magnetic field sensor are disposed on the substrate along a circumference of a circle that is centered about the central substrate axis, and wherein the first 2D magnetic field sensor, the second 2D magnetic field sensor, the third 2D magnetic field sensor, and the fourth 2D magnetic field sensor are separated from one another by an angle of 90 degrees.

Example 20. The method of any combination of Examples 11-19, wherein the act of calculating the amplitude of the current flowing through the conductor comprises: using the first magnetic field component, the second magnetic field component, the third magnetic field component, and the fourth magnetic field component to calculate a first current amplitude; using the fifth magnetic field component, the sixth magnetic field component, the seventh magnetic field component, and the eighth magnetic field component to calculate a second current amplitude; and calculating the amplitude of the current flowing through the conductor by averaging the first current amplitude and the second current amplitude.

Example 21. A non-transitory computer-readable medium having instructions stored thereon that, when executed by control circuitry, cause the control circuitry to measure current flowing through a conductor having a conductor axis by: receiving, via a first two-dimensional (2D) magnetic field sensor disposed on a substrate having a cutout region disposed about a central substrate axis, a first magnetic field component measurement of a magnetic field generated by the current flowing through the conductor; receiving, via the first two-dimensional (2D) magnetic field sensor, a second magnetic field component measurement of the magnetic field generated by the current flowing through the conductor; receiving, via a second two-dimensional (2D) magnetic field sensor, a third magnetic field component measurement of the magnetic field generated by the current flowing through the conductor; receiving, via the second two-dimensional (2D) magnetic field sensor, a fourth magnetic field component measurement of the magnetic field generated by the current flowing through the conductor, wherein each of the first, the second, the third, and the fourth magnetic field component measurement represents a respective magnetic field component measurement as a function of four variables including (i) an amplitude $I_0$ of the current flowing through the conductor, (ii) an offset distance d between the conductor axis and the central substrate axis, (iii) an angle $\beta$ between the conductor axis and the central substrate axis, and (iv) an angular position $\alpha$ the first 2D magnetic field sensor with respect to an in-plane substrate axis that is orthogonal to the central substrate axis, and computing the amplitude $I_0$ of the current flowing through the conductor by using each of the first, the second, the third, and the fourth magnetic field component measurements to solve for the four variables.

Example 22. The non-transitory computer-readable medium of Example 21, wherein: the first magnetic field component measurement of the magnetic field generated by the current flowing through the conductor is represented by:

$$B_1 = \frac{\mu I_0}{2\pi} \frac{\cos \beta \ (r_0 - d \cos \alpha)}{\cos^2 \beta \ (r_0 \cos \alpha - d)^2 + r_0^2 \sin^2 \alpha},$$

the second magnetic field component measurement of the magnetic field generated by the current flowing through the conductor is represented by:

$$B_2 = \frac{\mu I_0}{2\pi} \frac{-d \cos \beta \sin \alpha}{\cos^2 \beta \ (r_0 \cos \alpha - d)^2 + r_0^2 \sin^2 \alpha},$$

and $r_0$ represents a predetermined radial distance between the central substrate axis and each of the first and the second 2D magnetic field sensors.

Example 23. The non-transitory computer-readable medium any combination of Examples 21-22, wherein: the third magnetic field component measurement of the magnetic field generated by the current flowing through the conductor is represented by:

$$B_3 = \frac{\mu I_0}{2\pi} \frac{\cos \beta \ (r_0 + d \sin(\alpha))}{\cos^2 \beta \ (r_0 \sin(\alpha) + d)^2 + r_0^2 \cos^2(\alpha)},$$

the fourth magnetic field component measurement of the magnetic field generated by the current flowing through the conductor is represented by:

$$B_4 = \frac{\mu I_0}{2\pi} \frac{-d \cos \beta \cos(\alpha)}{\cos^2 \beta \ (r_0 \sin(\alpha) + d)^2 + r_0^2 \cos^2(\alpha)}.$$

Example 24. The non-transitory computer-readable medium of any combination of Examples 21-23, wherein the computer-readable instructions, when executed by control circuitry, cause the control circuitry to measure the current $I_0$ flowing through the conductor by: evaluating each of the first, the second, the third, and the fourth magnetic field component measurements $B_1$, $B_2$, $B_3$, $B_4$, respectively, of the magnetic field generated by the current flowing through the conductor to calculate (i) the offset distance d, (ii) the angle $\beta$, and (iii) the angular position $\alpha$; and calculating the amplitude $I_0$ of the current flowing through the conductor by evaluating one or more of the first, the second, the third, and the fourth magnetic field component measurements $B_1$, $B_2$, $B_3$, $B_4$, respectively, of the magnetic field generated by the current flowing through the conductor using the calculated offset distance d, the calculated angle $\beta$, the calculated angular position $\alpha$, and a predetermined radial distance between the central substrate axis and each of the first and the second 2D magnetic field sensors.

CONCLUSION

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" or "circuitry" used herein are to be interpreted in a sense not only including hardware but also software, firmware or any combinations thereof. The term "data" may be interpreted to include any form of representation data. The term "information" may in addition to any form of digital information also include other forms of representing information. The term "entity" or "unit" may in embodiments include any device, apparatus circuits, hardware, software, firmware, chips, or other semiconductors as well as logical units or physical implementations of protocol layers etc. Furthermore the terms "coupled" or "connected" may be interpreted in a broad sense not only covering direct but also indirect coupling.

It is further to be noted that methods disclosed in the specification or in the claims may be implemented by a device having means for performing each of the respective steps of these methods.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A device for measuring current flowing through a conductor having a conductor axis, comprising:
   a substrate having a cutout region disposed about a central substrate axis;
   a first two-dimensional (2D) magnetic field sensor disposed on the substrate and configured to measure a first magnetic field component and a second magnetic field component of a magnetic field generated by the current flowing through the conductor when the conductor is arranged to pass through the substrate via the cutout region, the first magnetic field component and the second magnetic field component being perpendicular to one another;
   a second two-dimensional (2D) magnetic field sensor disposed on the substrate and configured to measure a third magnetic field component and a fourth magnetic field component of the magnetic field generated by the current flowing through the conductor when the conductor is arranged to pass through the substrate via the cutout region, the third magnetic field component and the fourth magnetic field component being perpendicular to one another; and
   control circuitry configured to calculate, with a position of the conductor axis with respect to the central substrate axis being an unknown variable, an amplitude of the current flowing through the conductor using the first magnetic field component, the second magnetic field component, the third magnetic field component, and the fourth magnetic field component.

2. The device of claim 1, wherein the first 2D magnetic field sensor and the second 2D magnetic field sensor are disposed on the substrate at an equal distance from the central substrate axis.

3. The device of claim 1, wherein the first 2D magnetic field sensor and the second 2D magnetic field sensor are disposed on the substrate along a circumference of a circle that is centered about the central substrate axis.

4. The device of claim 3, wherein the first 2D magnetic field sensor and the second 2D magnetic field sensor are separated from one another by an angle of 90 degrees.

5. The device of claim 3, wherein the first 2D magnetic field sensor and the second 2D magnetic field sensor are arranged such that (i) the first magnetic field component and the third magnetic field component correspond to a tangential magnetic field component aligned with a tangential direction of the circle, and (ii) the second magnetic field component and the fourth magnetic field component correspond to a radial magnetic field component aligned with a radial direction of the circle.

6. The device of claim 3, wherein the first 2D magnetic field sensor and the second 2D magnetic field sensor are arranged such that (i) the first magnetic field component and the third magnetic field component correspond to an offset tangential magnetic field component that is rotated by a first angle from a tangential direction of the circle, and (ii) the second magnetic field component and the fourth magnetic field component correspond to an offset radial magnetic field component that is rotated by a second angle from a radial direction of the circle.

7. The device of claim 1, wherein the first magnetic field component, the second magnetic field component, the third magnetic field component, and the fourth magnetic field component are each in-plane with the substrate.

8. The device of claim 1, wherein the control circuitry is configured to calculate the amplitude of the current flowing through the conductor independently of the conductor axis being rotated or offset with respect to the central substrate axis.

9. The device of claim 1, further comprising:
a third two-dimensional (2D) magnetic field sensor disposed on the substrate and configured to measure a fifth magnetic field component and a sixth magnetic field component of a magnetic field generated by the current flowing through the conductor when the conductor is arranged to pass through the substrate via the cutout region, the fifth magnetic field component and the sixth magnetic field component being perpendicular to one another;
a fourth two-dimensional (2D) magnetic field sensor disposed on the substrate and configured to measure a seventh magnetic field component and an eighth magnetic field component of the magnetic field generated by the current flowing through the conductor when the conductor is arranged to pass through the substrate via the cutout region, the seventh magnetic field component and the eighth magnetic field component being perpendicular to one another,
wherein the first 2D magnetic field sensor, the second 2D magnetic field sensor, the third 2D magnetic field sensor, and the fourth 2D magnetic field sensor are disposed on the substrate along a circumference of a circle that is centered about the central substrate axis, and
wherein the first 2D magnetic field sensor, the second 2D magnetic field sensor, the third 2D magnetic field sensor, and the fourth 2D magnetic field sensor are separated from one another by an angle of 90 degrees.

10. The device of claim 9, wherein the control circuitry is configured to calculate the amplitude of the current flowing through the conductor by:
using the first magnetic field component, the second magnetic field component, the third magnetic field component, and the fourth magnetic field component to calculate a first current amplitude;
using the fifth magnetic field component, the sixth magnetic field component, the seventh magnetic field component, and the eighth magnetic field component to calculate a second current amplitude; and
calculating the amplitude of the current flowing through the conductor by averaging the first current amplitude and the second current amplitude.

11. The device of claim 1, wherein:
the first 2D magnetic field sensor and the second 2D magnetic field sensor are disposed on the substrate along a circumference of a circle that is centered about the central substrate axis,
the first 2D magnetic field sensor and the second 2D magnetic field sensor are separated from one another by an angle of 90 degrees, and
the device only includes the first 2D magnetic field sensor and the second 2D magnetic field sensor such that the control circuitry is configured to calculate the amplitude of the current flowing through the conductor using only (i) the first magnetic field component, (ii) the second magnetic field component, (iii) the third magnetic field component, and (iv) the fourth magnetic field component.

12. A method for measuring current flowing through a conductor having a conductor axis, comprising:
measuring, via a first two-dimensional (2D) magnetic field sensor arranged on a substrate having a cutout region disposed about a central substrate axis, a first magnetic field component and a second magnetic field component of a magnetic field generated by the current flowing through the conductor when the conductor is arranged to pass through the substrate via the cutout region, the first magnetic field component and the second magnetic field component being perpendicular to one another;
measuring, via a second two-dimensional (2D) magnetic field sensor disposed on the substrate, a third magnetic field component and a fourth magnetic field component of the magnetic field generated by the current flowing through the conductor when the conductor is arranged to pass through the substrate via the cutout region, the third magnetic field component and the fourth magnetic field component being perpendicular to one another; and
calculating, with a position of the conductor axis with respect to the central substrate axis being an unknown variable, an amplitude of the current flowing through the conductor using the first magnetic field component, the second magnetic field component, the third magnetic field component, and the fourth magnetic field component.

13. The method of claim 12, wherein the first 2D magnetic field sensor and the second 2D magnetic field sensor are disposed on the substrate at an equal distance from the central substrate axis.

14. The method of claim 12, wherein the first 2D magnetic field sensor and the second 2D magnetic field sensor are disposed on the substrate along a circumference of a circle that is centered about the central substrate axis.

15. The method of claim 14, wherein the first 2D magnetic field sensor and the second 2D magnetic field sensor are separated from one another by an angle of 90 degrees.

16. The method of claim 14, wherein the first 2D magnetic field sensor and the second 2D magnetic field sensor are arranged such that (i) the first magnetic field component and the third magnetic field component correspond to a tangential magnetic field component aligned with a tangential direction of the circle, and (ii) the second magnetic field component and the fourth magnetic field component correspond to a radial magnetic field component aligned with a radial direction of the circle.

17. The method of claim 14, wherein the first 2D magnetic field sensor and the second 2D magnetic field sensor are arranged such that (i) the first magnetic field component and the third magnetic field component correspond to an offset tangential magnetic field component that is rotated by a first angle from a tangential direction of the circle, and (ii) the second magnetic field component and the fourth magnetic field component correspond to an offset radial magnetic field component that is rotated by a second angle from a radial direction of the circle.

18. The method of claim 12, wherein the first magnetic field component, the second magnetic field component, the third magnetic field component, and the fourth magnetic field component are in-plane with the substrate.

19. The method of claim 12, wherein the act of calculating the amplitude of the current flowing through the conductor comprises calculating the amplitude of the current flowing through the conductor independently of the conductor axis being rotated or offset with respect to the central substrate axis.

20. The method of claim 12, further comprising:
measuring, via a third two-dimensional (2D) magnetic field sensor disposed on the substrate, a fifth magnetic field component and a sixth magnetic field component of a magnetic field generated by the current flowing through the conductor when the conductor is arranged to pass through the substrate via the cutout region, the fifth magnetic field component and the sixth magnetic field component being perpendicular to one another; and
measuring, via a fourth two-dimensional (2D) magnetic field sensor disposed on the substrate, a seventh magnetic field component and an eighth magnetic field component of the magnetic field generated by the current flowing through the conductor when the conductor is arranged to pass through the substrate via the cutout region, the seventh magnetic field component and the eighth magnetic field component being perpendicular to one another,
wherein the first 2D magnetic field sensor, the second 2D magnetic field sensor, the third 2D magnetic field sensor, and the fourth 2D magnetic field sensor are disposed on the substrate along a circumference of a circle that is centered about the central substrate axis, and
wherein the first 2D magnetic field sensor, the second 2D magnetic field sensor, the third 2D magnetic field sensor, and the fourth 2D magnetic field sensor are separated from one another by an angle of 90 degrees.

21. The method of claim 20, wherein the act of calculating the amplitude of the current flowing through the conductor comprises:
using the first magnetic field component, the second magnetic field component, the third magnetic field component, and the fourth magnetic field component to calculate a first current amplitude;
using the fifth magnetic field component, the sixth magnetic field component, the seventh magnetic field component, and the eighth magnetic field component to calculate a second current amplitude; and
calculating the amplitude of the current flowing through the conductor by averaging the first current amplitude and the second current amplitude.

22. A non-transitory computer-readable medium having instructions stored thereon that, when executed by control circuitry, cause the control circuitry to measure current flowing through a conductor having a conductor axis by:
receiving, via a first two-dimensional (2D) magnetic field sensor disposed on a substrate having a cutout region disposed about a central substrate axis, a first magnetic field component measurement of a magnetic field generated by the current flowing through the conductor;
receiving, via the first two-dimensional (2D) magnetic field sensor, a second magnetic field component measurement of the magnetic field generated by the current flowing through the conductor;
receiving, via a second two-dimensional (2D) magnetic field sensor, a third magnetic field component measurement of the magnetic field generated by the current flowing through the conductor;
receiving, via the second two-dimensional (2D) magnetic field sensor, a fourth magnetic field component measurement of the magnetic field generated by the current flowing through the conductor,
wherein each of the first, the second, the third, and the fourth magnetic field component measurement represents a respective magnetic field component measurement as a function of four variables including (i) an amplitude $I_0$ of the current flowing through the conductor, (ii) an offset distance d between the conductor axis and the central substrate axis, (iii) an angle $\beta$ between the conductor axis and the central substrate axis, and (iv) an angular position $\alpha$ of the first 2D magnetic field sensor with respect to an in-plane substrate axis that is orthogonal to the central substrate axis, and
computing the amplitude $I_0$ of the current flowing through the conductor by using each of the first, the second, the third, and the fourth magnetic field component measurements to solve for the four variables.

23. The non-transitory computer-readable medium of claim 22, wherein:
the first magnetic field component measurement of the magnetic field generated by the current flowing through the conductor is represented by:

$$B_1 = \frac{\mu I_0}{2\pi} \frac{\cos\beta \; (r_0 - d\cos\alpha)}{\cos^2\beta \; (r_0 \cos\alpha - d)^2 + r_0^2 \sin^2\alpha},$$

the second magnetic field component measurement of the magnetic field generated by the current flowing through the conductor is represented by:

$$B_2 = \frac{\mu I_0}{2\pi} \frac{-d \cos\beta \sin\alpha}{\cos^2\beta \; (r_0 \cos\alpha - d)^2 + r_0^2 \sin^2\alpha},$$

and
$r_0$ represents a predetermined radial distance between the central substrate axis and each of the first and the second 2D magnetic field sensors.

24. The non-transitory computer-readable medium of claim 23, wherein:
the third magnetic field component measurement of the magnetic field generated by the current flowing through the conductor is represented by:

$$B_3 = \frac{\mu I_0}{2\pi} \frac{\cos\beta\ (r_0 + d\ \sin(\alpha))}{\cos^2\beta\ (r_0\ \sin(\alpha) + d)^2 + r_0^2\ \cos^2(\alpha)},$$

the fourth magnetic field component measurement of the magnetic field generated by the current flowing through the conductor is represented by:

$$B_4 = \frac{\mu I_0}{2\pi} \frac{-d\ \cos\beta\cos(\alpha)}{\cos^2\beta\ (r_0\ \sin(\alpha) + d)^2 + r_0^2\ \cos^2(\alpha)}.$$

25. The non-transitory computer-readable medium of claim 24, wherein the computer-readable instructions, when executed by control circuitry, cause the control circuitry to measure the current $I_0$ flowing through the conductor by:

evaluating each of the first, the second, the third, and the fourth magnetic field component measurements $B_1$, $B_2$, $B_3$, $B_4$, respectively, of the magnetic field generated by the current flowing through the conductor to calculate (i) the offset distance d, (ii) the angle $\beta$, and (iii) the angular position $\alpha$; and calculating the amplitude $I_0$ of the current flowing through the conductor by evaluating one or more of the first, the second, the third, and the fourth magnetic field component measurements $B_1$, $B_2$, $B_3$, $B_4$, respectively, of the magnetic field generated by the current flowing through the conductor using the calculated offset distance d, the calculated angle $\beta$, the calculated angular position $\alpha$, and a predetermined radial distance between the central substrate axis and each of the first and the second 2D magnetic field sensors.

* * * * *